(12) United States Patent
Han et al.

(10) Patent No.: US 12,294,840 B2
(45) Date of Patent: May 6, 2025

(54) MICROPHONE AMPLIFYING CIRCUIT DESIGN METHOD AND MICROPHONE AMPLIFYING CIRCUIT

(71) Applicant: AAC ACOUSTIC TECHNOLOGIES (SHENZHEN) CO., LTD., Shenzhen (CN)

(72) Inventors: Dong Han, Singapore (SG); Chuationg Kee, Singapore (SG)

(73) Assignee: AAC ACOUSTIC TECHNOLOGIES (SHENZHEN) CO., LTD., Shenzhen (CN)

( * ) Notice: Subject to any disclaimer, the term of this patent is extended or adjusted under 35 U.S.C. 154(b) by 0 days.

(21) Appl. No.: 17/918,899

(22) PCT Filed: Apr. 21, 2022

(86) PCT No.: PCT/CN2022/088162
§ 371 (c)(1),
(2) Date: Oct. 13, 2022

(87) PCT Pub. No.: WO2023/184625
PCT Pub. Date: Oct. 5, 2023

(65) Prior Publication Data
US 2025/0024199 A1    Jan. 16, 2025

(30) Foreign Application Priority Data
Apr. 1, 2022   (CN) .......................... 202210353358.7

(51) Int. Cl.
*H04R 3/00*     (2006.01)
*H03F 3/187*    (2006.01)

(52) U.S. Cl.
CPC ............. *H04R 3/002* (2013.01); *H03F 3/187* (2013.01); *H03F 2200/03* (2013.01); *H03F 2200/21* (2013.01); *H03F 2200/267* (2013.01)

(58) Field of Classification Search
CPC .. H03F 3/187; H03F 3/505; H03F 2203/5015; H03F 2200/21; H03F 2200/03;
(Continued)

(56) References Cited

U.S. PATENT DOCUMENTS

2012/0155675 A1 * 6/2012 Froehlich ................ H03F 1/523
                                                                    381/120
2013/0015919 A1 * 1/2013 Kropfitsch ................ H03F 1/38
                                                                    330/260

(Continued)

*Primary Examiner* — Carolyn R Edwards
*Assistant Examiner* — Julie X Dang
(74) *Attorney, Agent, or Firm* — Wiersch Law Group

(57) ABSTRACT

The present invention provides a microphone amplifying circuit including an amplifier, a bias resistor, an input end, an output end, a microphone capacitor, a first parasitic capacitor and a second parasitic capacitor. The first parasitic capacitor is connected to the input end, and the other end of the first parasitic capacitor is connected to the output end. The second parasitic capacitor is connected to the output end, and the other end of the second parasitic capacitor is grounded. The first parasitic capacitor and the second parasitic capacitor are formed after adding a layer of underlying metal between the substrate of the integrated circuit and the welding plate. Compared with the related art, the microphone amplifying circuit design method and the microphone amplifying circuit of the present invention have higher signal to noise ratio and better performance.

10 Claims, 4 Drawing Sheets

(58) Field of Classification Search
CPC ....... H03F 2203/5024; H03F 2200/267; H04R 3/002; H04R 19/04
USPC ........... 381/95, 122, 113, 174, 111, 369, 396
See application file for complete search history.

(56) References Cited

U.S. PATENT DOCUMENTS

2016/0164477 A1* 6/2016 Duenser ................. H03F 3/183
 381/121
2025/0024199 A1* 1/2025 Han ....................... H03F 3/187

\* cited by examiner providing a layer of underlying metal set between a substrate of a integrated circuit and a welding plate; wherein the welding plate, the underlying metal and the substrate are insulated from each other, a first parasitic capacitor is formed between the welding plate and the underlying metal, and a second parasitic capacitor is formed between the underlying metal and the substrate ⸺ s1 seeking the circuit point in the amplifying circuit, and making the circuit point satisfy the following conditions which are that:
a. the circuit point and the input end are in the same phase;
b. the voltage gain of the circuit point and the input end is greater than or equal to 0.8;
c. the circuit point is in the signal path from the input end to the output end ⸺ s2 connecting the underlying metal to the circuit point, and connecting the welding plate to the input end ⸺ s3 welding the microphone to the welding plate of the integrated circuit to connect the microphone and act as the microphone capacitor; wherein one end of the microphone capacitor is connected to the high voltage bias voltage, and the other end is connected to the input end; one end of the first parasitic capacitor is connected to the input end, and the other end is connected to the output end; the second parasitic capacitor is connected to the output end, and the other end of the second parasitic capacitor is grounded ⸺ s4

Fig. 2

МICROPHONE AMPLIFYING CIRCUIT DESIGN METHOD AND MICROPHONE AMPLIFYING CIRCUIT

TECHNICAL FIELD

The invention relates to the field of a microphone amplifying circuit, in particular to a microphone amplifying circuit design method and a microphone amplifying circuit which can eliminate the influence of parasitic capacitor of welding plate on the signal to noise ratio.

BACKGROUND ART

With the development of mobile communication technology, mobile terminals such as mobile phones, pads, and notebook computers have gradually become indispensable electronic products in life. For these electronic products, the built-in microphone is used as a sound pickup unit, and the signal to noise ratio when the picked-up signal is output through the microphone amplifying circuit is an important evaluation index for product performance.

The related art microphone amplifying circuit, as shown in FIG. 1, the microphone is welded to the microphone amplifying circuit of the integrated circuit through a welding plate. Between the welding plate mt' and the substrate p-sub' of the integrated circuit, a parasitic capacitor $c_{pad}'$ of welding plate is formed, and the parasitic capacitor $c_{pad}'$ of welding plate and the microphone capacitor $c_{mic}'$ of the microphone form a capacitor series circuit. The signal amplitude at input end $V_{in}'$ is reduced by the voltage divider. The amplifier m1' has circuit noise, and the voltage division of the parasitic capacitor $c_{pad}'$ of the welding plate causes the input signal to become smaller, thereby causing the signal to noise ratio at the output end $v_{out}'$ of the microphone amplifying circuit to become smaller. Especially when the microphone capacitor $c_{mic}'$ of the microphone is relatively small, the partial pressure is more significant, and the signal to noise ratio is reduced more significantly, which makes the performance of the microphone amplifying circuit not good.

Therefore, it is necessary to provide a new microphone amplifying circuit design method and a microphone amplifying circuit to solve the above problems.

SUMMARY OF THE INVENTION

The technical problem to be solved by the present invention is to provide a microphone amplifying circuit design method and a microphone amplifying circuit with high signal to noise ratio.

Compared with the related art, in the microphone amplifying circuit design method and the microphone amplifying circuit of the present invention, a layer of underlying metal is arranged between the welding plate and the substrate of the integrated circuit to shield the capacity of the welding plate, thereby forming a new first parasitic capacitor and second parasitic capacitor. By looking for a circuit point that satisfies the conditions in the amplifying circuit, the underlying metal is connected to the circuit point. Therefore, the signals at both ends of the first parasitic capacitor are in same phase and the gain is greater than or equal to 0.8. The capacitor has no or very little charge change. For the microphone, there is no load effect or a small load effect at the input end, so the input signal will not be reduced due to voltage division. The second parasitic capacitor is used as the load of the output end, and the driving capability of the output end is large enough to have no effect on the signal to noise ratio at the output end. Therefore, the influence of the parasitic capacitor of the welding plate on the signal to noise ratio of the microphone amplifying circuit is greatly weakened or even eliminated, and the circuit performance is effectively improved.

For achieving the above-mentioned object, the present invention provides a microphone amplifying circuit design method, applied to a microphone and an amplifying circuit, the amplifying circuit including an amplifier, a bias resistor connecting to an input of the amplifier by which the amplifier is connected to a bias voltage, an input end connecting to the input of the amplifier and an output end connecting to the amplifier. The method includes steps of:

providing a layer of underlying metal set between a substrate of a integrated circuit and a welding plate; wherein the welding plate, the underlying metal and the substrate are insulated from each other, a first parasitic capacitor is formed between the welding plate and the underlying metal, and a second parasitic capacitor is formed between the underlying metal and the substrate;

seeking the circuit point in the amplifying circuit, and making the circuit point satisfy the following conditions which are that:

a. the circuit point and the input end are in the same phase;
b. the voltage gain of the circuit point and the input end is greater than or equal to 0.8;
c. the circuit point is in the signal path from the input end to the output end;

connecting the underlying metal to the circuit point, and connecting the welding plate to the input end;

welding the microphone to the welding plate of the integrated circuit to connect the microphone and act as the microphone capacitor; wherein one end of the microphone capacitor is connected to the high voltage bias voltage, and the other end of the microphone capacitor is connected to the input end; one end of the first parasitic capacitor is connected to the input end, and the other end of the first parasitic capacitor is connected to the output end; the second parasitic capacitor is connected to the output end, and the other end of the second parasitic capacitor is grounded.

Further, the circuit point is the output end.

Further, the amplifier is a transistor, and a grid electrode of the transistor is used as the input end, the transistor is used as the output end, and a drain electrode of the transistor is grounded.

Further, the amplifying circuit further includes a constant current source; one end of the constant current source is connected to the power supply voltage, and the other end of the constant current source is connected to the source electrode of the transistor for providing bias current to the transistor.

Further, the microphone capacitor is a changeable capacitor.

The present invention further provides a microphone amplifying circuit, including an amplifier, a bias resistor, an input end, an output end, a microphone capacitor, a first parasitic capacitor and a second parasitic capacitor. The amplifier is connected to the input end, and the output of the amplifier is connected to the output end; the bias resistor is connected to the bias voltage, and the other end of the bias resistor is connected to the input end.

The microphone capacitor is connected to the high voltage bias voltage, and the other end of the microphone capacitor is connected to the input end. The first parasitic capacitor is connected to the input end, and the other end of the first parasitic capacitor is connected to the output end.

The second parasitic capacitor is connected to the output end, and the other end of the second parasitic capacitor is grounded. The first parasitic capacitor and the second parasitic capacitor are formed after adding a layer of underlying metal between the substrate of the integrated circuit and the welding plate. The first parasitic capacitor is formed by the spacing between the welding plate and the underlying metal, and the welding plate is connected to the input end; the second parasitic capacitor is formed by the spacing between the underlying metal and the substrate, and the underlying metal is connected to the output end.

In addition, the amplifier is a transistor, the grid electrode of the transistor is used as the input end, the source electrode of the transistor is used as the output end, and the drain electrode of the transistor is ground.

In addition, the amplifying circuit further includes a constant current source; one end of the constant current source is connected to the power supply voltage, and the other end of the constant current source is connected to the source electrode of the transistor for providing bias current to the transistor.

In addition, the microphone capacitor is a changeable capacitor.

In addition, the microphone amplifying circuit is designed and formed by the microphone amplifying circuit design method described above.

BRIEF DESCRIPTION OF DRAWINGS

Many aspects of the exemplary embodiments can be better understood with reference to the following drawings. The components in the drawing are not necessarily drawn to scale, the emphasis instead being placed upon clearly illustrating the principles of the present disclosure.

FIG. 2 is a flow chart of a microphone amplifying circuit design method provided by the present invention;

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Figure 1:
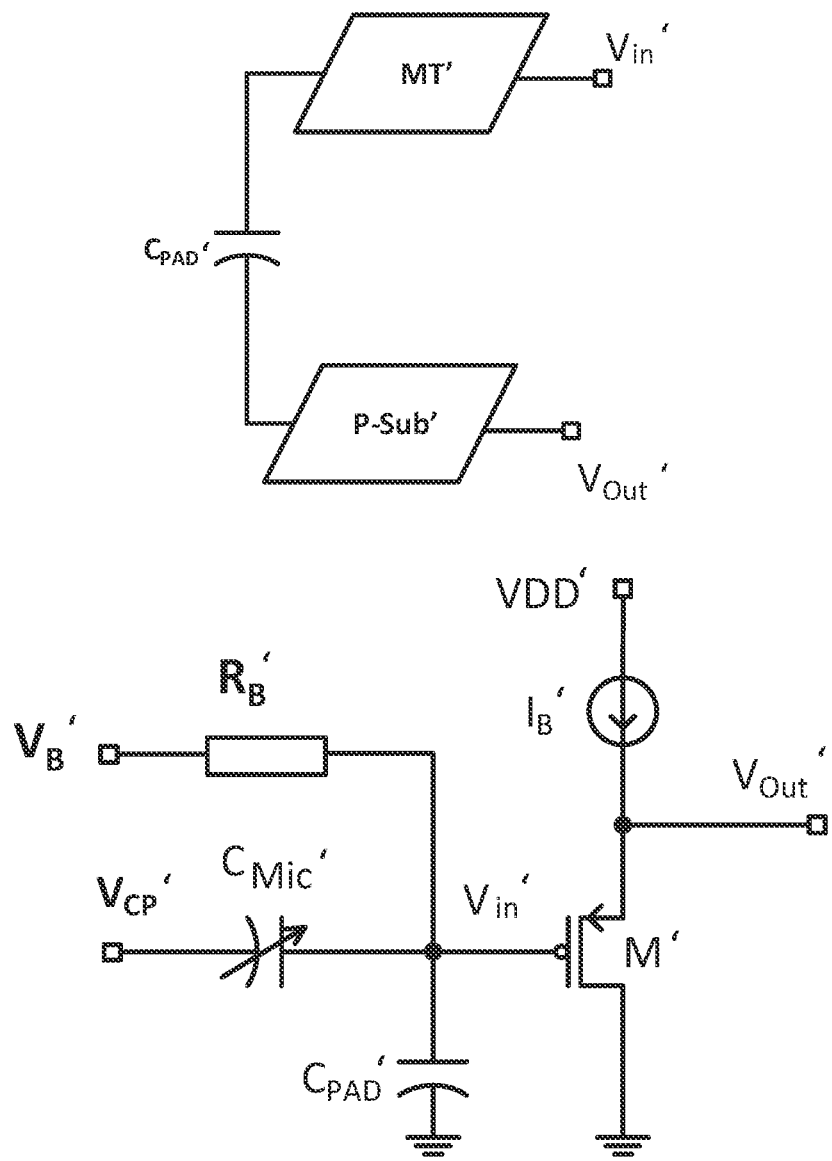
FIG. 1 illustrates an amplifying circuit of a related microphone.
Figure 3:
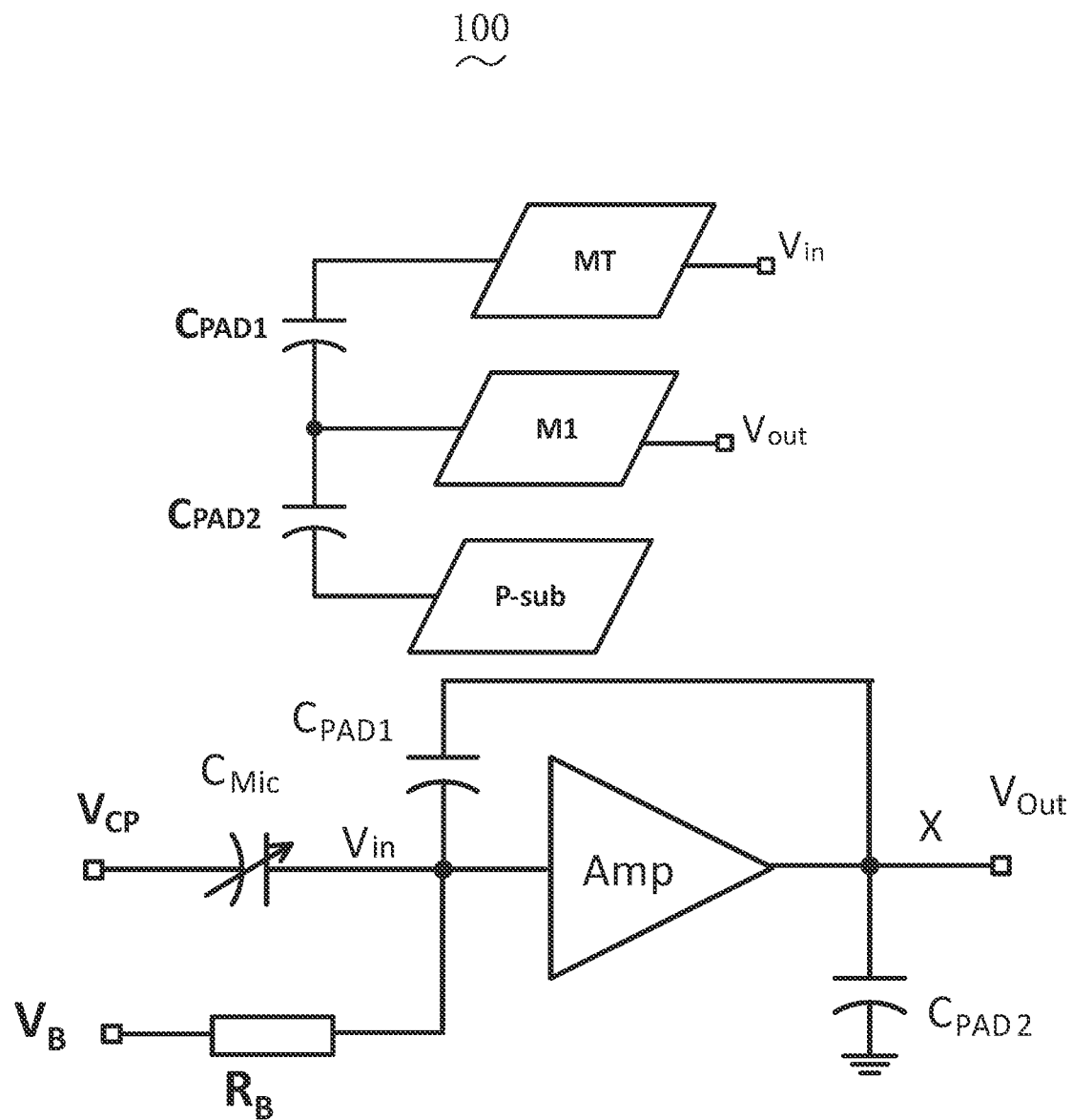
FIG. 3 illustrates an amplifying circuit of a microphone amplifying circuit of the present invention.

Referring to FIGS. 2-3, the present invention provides a microphone amplifying circuit design method, which is applied to a microphone and an amplifying circuit. The amplifying circuit includes an amplifier amp, a bias resistor rb, an input end $V_{in}$ and an output end $v_{out}$. The input of the amplifier amp is connected to the input end $v_{in}$ and connected to the bias voltage $v_b$ after being connecting to the bias resistor rb in series; the output of the amplifier amp is connected to the output end $v_{out}$. The method includes the following steps:

Step s1, a layer of underlying metal m1 is arranged between the substrate p-sub of the integrated circuit and the welding plate mt. The welding plate mt, the underlying metal m1 and the substrate p-sub are insulated and spaced apart from each other. A first parasitic capacitor $c_{pad1}$ is formed between the welding plate mt and the underlying metal m1, and a second parasitic capacitor $c_{pad2}$ is formed between the underlying metal m1 and the substrate p-sub.

The underlying metal m1 is used to shield the capacity of welding plate of welding plate mt, thus forming a new first parasitic capacitor $c_{pad1}$ and a new second parasitic capacitor $c_{pad2}$.

Step s2, find circuit point x in the amplifying circuit, and make the circuit point x satisfy the following conditions:
  a. The circuit point x is in phase with the input end $v_{in}$;
  b. The voltage gain of the circuit point x and the input end $v_{in}$ is greater than or equal to 0.8, preferably the gain here is 1. Of course, it is also feasible that the gain here is close to 1, such as 0.9, or 0.8, etc.
  c. The circuit point x is in the signal path from the input end $v_{in}$ to the output end $v_{out}$ of the amplifying circuit.

Find and determine the circuit point x in the amplifying circuit when the above three conditions are satisfied at the same time. In this embodiment, in the amplifying circuit, the circuit point x is determined as the output end $v_{out}$, and the output end $v_{out}$ satisfies the above three conditions.

Step s3, connect the underlying metal m1 to the circuit point x, and connect the welding plate mt to the input end $v_{in}$.

Step s4, welding the microphone to the welding plate mt of the integrated circuit to connect the microphone and act as the microphone capacitor $c_{mic}$, of the microphone capacitor $c_{mic}$ is connected to the high voltage bias voltage $v_{cp}$, and the other end of the microphone capacitor $c_{mic}$ is connected to the input end $v_{in}$. And one end of the first parasitic capacitor $c_{pad1}$ is connected to the input end $v_{in}$. The other end of the first parasitic capacitor $c_{pad1}$ is connected to the output end $v_{out}$, one end of the second parasitic capacitor $c_{pad2}$ is connected to the output end $v_{out}$, and the other end of the second parasitic capacitor $c_{pad2}$ is grounded.

In this embodiment, the microphone capacitor $c_{mic}$ is changeable capacitor.

Figure 4:
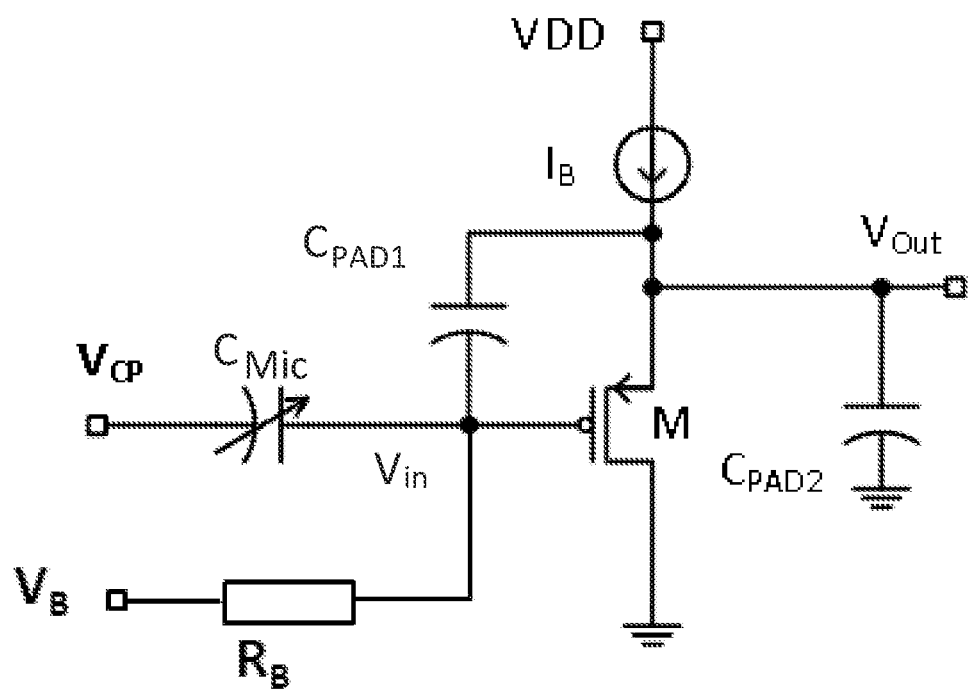
FIG. 4 is a circuit of the microphone amplifying circuit of in one of the embodiments in the present invention.

More preferably, as shown in FIG. 4, the present invention also provides another embodiment, that is, based on the embodiment in FIG. 3, the amplifier amp is a transistor m, and the grid electrode of transistor m is used as the input end $v_{in}$, or the grid electrode of transistor m is connected to the input end $v_{in}$. The source electrode of transistor m serves as the output end $v_{out}$, or the source electrode of transistor m is connected to the output end $v_{out}$. The drain electrode of transistor m is connected to ground.

More preferably, the amplifying circuit further includes a constant current source i. The constant current source i is connected to the power supply voltage vdd, and the other end of the constant current source i is connected to the source electrode of transistor m for providing bias current $i_b$ for the transistor m.

The microphone amplifying circuit designed by the above method of the present invention, for the first parasitic capacitor $c_{pad1}$, because the signals at both ends of the first parasitic capacitor $c_{pad1}$ are in the same phase, and the gain is 1. Therefore, the first parasitic capacitor $c_{pad1}$ has no charge change, and there is no load effect on the microphone at the input end $v_{in}$, so it will not divide the voltage and cause reduction of the input signal of the input end $v_{in}$. For the second parasitic capacitor $c_{pad2}$, it is the load of the output end $v_{out}$. The drive capability of the output end $v_{out}$ is large enough to have no effect on the signal to noise ratio at the output end $v_{out}$. Therefore, the parasitic capacitor of welding plate originally used for welding the welding plate of microphone is shielded by the setting of underlying metal m1, and a new first parasitic capacitor and a new second parasitic capacitor are formed. The parasitic capacitor of welding plate on the signal to noise ratio is effectively weakened or even eliminated, and the signal to noise ratio of the microphone amplifying circuit is effectively retuned and the circuit performance is improved.

Please refer to FIG. 3, an embodiment of the present invention also provides a microphone amplifying circuit 100, including an amplifier amp, a bias resistor $r_b$, an input end $v_{in}$ and an output end $v_{out}$, a microphone capacitor $c_{mic}$, a first parasitic capacitor $c_{pad1}$ and a second parasitic capacitor $c_{pad2}$.

The amplifier amp is connected to the input end $v_{in}$ and the output of the amplifier amp is connected to the output end $v_{out}$.

One end of the bias resistor $r_b$ is connected to the bias voltage $v_b$, and the other end of the bias resistor $r_b$ is connected to the input end $v_{in}$.

One end of the microphone capacitor $c_{mic}$ is connected to the high voltage bias voltage $v_{cp}$, and the other end of the microphone capacitor $c_{mic}$ is connected to the input end $v_{in}$. In this embodiment, the microphone capacitor $c_{mic}$ is changeable capacitor.

One end of the first parasitic capacitor $c_{pad1}$ is connected to the input end $v_{in}$, and the other end of the first parasitic capacitor $c_{pad1}$ is connected to the output end $v_{out}$. One end of the second parasitic capacitor $c_{pad2}$ is connected to the output end $v_{out}$, and the other end of the second parasitic capacitor $c_{pad2}$ is grounded.

Wherein, in the microphone amplifying circuit 100, specifically, the microphone capacitor $c_{mic}$ acts as a microphone. The first parasitic capacitor $c_{pad1}$ and the second parasitic capacitor $c_{pad2}$ are formed by adding a layer of the underlying metal m1 between the substrate p-sub of the integrated circuit and the welding plate mt. Insulated spacing between the welding plate mt and the underlying metal m1 forms the first parasitic capacitor $c_{pad1}$ and the welding plate mt is connected to the input end $v_{in}$, insulated spacing between the underlying metal m1 and the substrate p-sub forms the second parasitic capacitor $c_{pad2}$ and the underlying metal m1 is connected to the output end $v_{out}$.

More preferably, as shown in FIG. 4, the microphone amplifying circuit 100 also provides a specific embodiment, that is, the amp is a transistor m. The grid electrode of transistor m is used as the input end $v_{in}$, or the grid electrode of transistor m is connected to the input end $v_{in}$. The source electrode of transistor m is used as the output end $v_{out}$, or the source electrode of transistor m is connected to the output end $v_{out}$; the drain electrode of transistor m is connected to ground.

The microphone amplifying circuit 100 of the present invention, for the first parasitic capacitor $c_{pad1}$, signals at both ends of the first parasitic capacitor $c_{pad1}$ are in the same phase, and the gain is 1. Therefore, the first parasitic capacitor $c_{pad1}$ has no charge change, and there is no load effect on the microphone at the input end $v_{in}$, so it will not divide the voltage and cause reduction of the input signal of the input end $v_{in}$. For the second parasitic 20) capacitor $c_{pad2}$, which is the load of output end $v_{out}$, driving capability of the output end $v_{out}$ is large enough to have no effect on the signal to noise ratio at output end $v_{out}$. Therefore, the parasitic capacitor of welding plate originally used for welding the welding plate of microphone is shielded by the setting of underlying metal m1, and a new first parasitic capacitor and a new second parasitic capacitor are formed. The parasitic capacitor of welding plate on the signal to noise ratio is effectively weakened or even eliminated, and the signal to noise ratio of the microphone amplifying circuit is effectively retuned and the circuit performance is improved.

More preferably, the amplifying circuit further includes a constant current source i. The constant current source i is connected to the power supply voltage vdd, and the other end of the constant current source i is connected to the source electrode of transistor m for providing bias current $i_b$ for the transistor m.

It should be noted that the microphone amplifying circuit of the present invention is designed and formed by the above-mentioned microphone amplifying circuit design method provided by the present invention.

Compared with the related art, in the microphone amplifying circuit design method and the microphone amplifying circuit of the present invention, a layer of underlying metal is arranged between the welding plate and the substrate of the integrated circuit to shield the capacity of the welding plate. Thus, the new first parasitic capacitor and second parasitic capacitor are formed, and the underlying metal is connected to the circuit point by finding a circuit point that satisfies the conditions in the amplifying circuit. Therefore, the signals at both ends of the first parasitic capacitor are in the same phase and the gain is greater than or equal to 0.8, and the capacitor has no or very little charge change. For the microphone, there is no load effect or a small load effect at the input end, so the input signal will not be reduced due to voltage division. The second parasitic capacitor is used as the load of the output end, and the driving capability of the output end is large enough to have no effect on the signal to noise ratio at the output end. Therefore, the influence of the parasitic capacitor of the welding plate on the signal to noise ratio of the microphone amplifying circuit is greatly weakened or even eliminated, and the circuit performance is effectively improved.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A microphone amplifying circuit design method, applied to a microphone and an amplifying circuit, the amplifying circuit including an amplifier, a bias resistor connecting to an input of the amplifier by which the amplifier is connected to a bias voltage, an input end connecting to the input of the amplifier and an output end connecting to the amplifier; the method including steps of: providing a layer of underlying metal set between a substrate of an integrated circuit and a welding plate;
   wherein the welding plate, the underlying metal and the substrate are insulated from each other, a first parasitic capacitor is formed between the welding plate and the underlying metal, and a second parasitic capacitor is formed between the underlying metal and the substrate;
   seeking a circuit point circuit point in the amplifying circuit, and making the circuit point satisfy the following conditions which are that:
   a. the circuit point and the input end are in a same phase;
   b. a voltage gain of the circuit point and the input end is greater than or equal to 0.8; 20 c. the circuit point is in a signal path from the input end to the output end;

connecting the underlying metal to the circuit point, and connecting the welding plate to the input end;

welding the microphone to the welding plate of the integrated circuit to connect the microphone and act as a microphone capacitor;

wherein one end of the microphone capacitor is connected to a high voltage bias voltage, and an other end of the microphone capacitor is connected to the input end; one end of the first parasitic capacitor is connected to the input end, and an other end of the first parasitic capacitor is connected to the output end;

the second parasitic capacitor is connected to the output end, and an other end of the second parasitic capacitor is grounded.

2. The microphone amplifying circuit design method as described in claim 1, wherein the circuit point is the output end.

3. The microphone amplifying circuit design method as described in claim 1, wherein, the amplifier is a transistor, and a grid electrode of the transistor is used as the input end, the transistor is used as the output end, and a drain electrode of the transistor is grounded.

4. The microphone amplifying circuit design method as described in claim 3, wherein the amplifying circuit further includes a constant current source;

one end of the constant current source is connected to a power supply voltage, and an other end of the constant current source is connected to a source electrode of the transistor for providing bias current to the transistor.

5. The microphone amplifying circuit design method as described in claim 1, wherein the microphone capacitor is a changeable capacitor.

6. A microphone amplifying circuit, including an amplifier, a bias resistor, an input end, an output end, a microphone capacitor, a first parasitic capacitor and a second parasitic capacitor; wherein the amplifier is connected to the input end, and the output of the amplifier is connected to the output end;

the bias resistor is connected to a bias voltage, and an other end of the bias resistor is connected to the input end;

the microphone capacitor is connected to a high voltage bias voltage, and an other end of the microphone capacitor is connected to the input end;

the first parasitic capacitor is connected to the input end, and an other end of the first parasitic capacitor is connected to the output end;

the second parasitic capacitor is connected to the output end, and an other end of the second parasitic capacitor is grounded;

the first parasitic capacitor and the second parasitic capacitor are formed after adding a layer of underlying metal between a substrate of an integrated circuit and a welding plate; the first parasitic capacitor is formed by a spacing between the welding plate and the underlying metal, and the welding plate is connected to the input end; the second parasitic capacitor is formed by the spacing between the underlying metal and the substrate, and the underlying metal is connected to the output end.

7. The microphone amplifying circuit as described in claim 6, wherein the amplifier is a transistor, a grid electrode of the transistor is used as the input end, a source electrode of the transistor is used as the output end, and a drain electrode of the transistor is ground.

8. The microphone amplifying circuit as described in claim 7, wherein the amplifying circuit further includes a constant current source; one end of the constant current source is connected to a power supply voltage, and an other end of the constant current source is connected to the source electrode of the transistor for providing bias current to the transistor.

9. The microphone amplifying circuit as described in claim 6, wherein the microphone capacitor is a changeable capacitor.

10. The microphone amplifying circuit as described in claim 6, wherein the microphone amplifying circuit is designed and formed by the microphone amplifying circuit design method as described in claim 1.

* * * * *